US008711556B2

(12) United States Patent
Salatandre

(10) Patent No.: US 8,711,556 B2
(45) Date of Patent: Apr. 29, 2014

(54) BUSINESS CARD ASSEMBLY

(76) Inventor: Edgar Davin Salatandre, Brampton (CA)

( * ) Notice: Subject to any disclaimer, the term of this patent is extended or adjusted under 35 U.S.C. 154(b) by 191 days.

(21) Appl. No.: 13/443,674

(22) Filed: Apr. 10, 2012

(65) Prior Publication Data

US 2013/0265707 A1 Oct. 10, 2013

(51) Int. Cl.

| | |
|---|---|
| ***H05K 5/00*** | (2006.01) |
| ***H05K 7/00*** | (2006.01) |
| ***A47B 81/00*** | (2006.01) |
| ***H01R 13/62*** | (2006.01) |

(52) U.S. Cl.
USPC ............ 361/679.32; 361/679.31; 361/679.33; 361/679.38; 312/223.2; 439/157

(58) Field of Classification Search
USPC ................. 361/679.31–679.4, 679.55–679.6, 361/724–727; 312/223.1, 223.2; 439/60, 439/151–160, 327, 328, 331, 638; 369/75.11, 75.21, 76, 77.11, 77.21, 78, 369/79, 80, 81, 82
See application file for complete search history.

(56) References Cited

U.S. PATENT DOCUMENTS

| | | | | |
|---|---|---|---|---|
| 4,592,573 | A * | 6/1986 | Crowell | 283/56 |
| 7,310,692 | B2 * | 12/2007 | Miller et al. | 710/11 |
| 7,364,468 | B2 * | 4/2008 | Liu et al. | 439/638 |

* cited by examiner

*Primary Examiner* — Jenny L Wagner
*Assistant Examiner* — Jerry Wu
(74) *Attorney, Agent, or Firm* — Head, Johnson & Kachigian, P.C.

(57) ABSTRACT

A card for use with a computer comprises two panels. One panel is connected to the other for movement about an axis to permit movement of the one between a closed position, wherein the panels are stacked, and an open position, wherein the panels extend away from one another. An apparatus can be coupled to said device and is coupled to the one panel such that the apparatus: moves with the one panel as same moves between the open and closed positions; and is movable relative to the one panel, in a direction perpendicular to the axis, between a retracted position, wherein the apparatus is disposed in stacked relation to the one panel, and an extended position, wherein the apparatus extends beyond the one panel. A mechanism causes the apparatus to move, upon movement of the one panel between the open and closed position, between the extended and retracted position.

15 Claims, 7 Drawing Sheets

BUSINESS CARD ASSEMBLY

BACKGROUND OF THE INVENTION

1. Field of the Invention

The invention relates to the field of business cards.

2. Background of the Invention

The business card is widely accepted as a convenient mechanism for transmitting identification information to a third party. Business cards are often viewed as an important marketing and advertising tools and take many forms, including but not limited to: paperboard cards, plastic cards, metal cards, printed cards, engraved cards, die cut cards, talking cards, fridge magnet cards, video cards and USB cards.

SUMMARY OF THE INVENTION

A business card for use with a computing device forms one aspect of the invention. The business card comprises two panels; an apparatus; and a mechanism.

The two panels have an associated axis. One of the two panels is connected to the other of the two panels for movement about the axis in a manner analogous to the movement of a page in a book so as to permit movement of the one panel relative to the other between a closed position, wherein the two panels are disposed in stacked relation to one another, and an open position, wherein the panels extend away from one another and away from the axis and are at least substantially coplanar.

The apparatus is adapted for coupling to said computing device and is itself operatively coupled to the one of the two panels such that the apparatus: moves with the one of the panels as the one panel moves relative to the other panel between the open and closed positions; and is movable relative to the one of the panels, in a direction substantially perpendicular to the axis, between a retracted position, wherein the apparatus is disposed in stacked relation to the one of the panels, and an extended position, wherein the apparatus extends beyond the one of the panels.

The mechanism is for causing the apparatus to move, upon movement of the one panel between the open position and the closed position, between the extended position and the retracted position.

According to another aspect, the mechanism can comprise: an extension panel, the extension panel being orientated substantially coplanar with the other of the panels and extending away from both the other of the panels and the axis to a terminal edge that is substantially parallel to the axis; and a link that is hingedly coupled to the terminal edge for relative movement of the link about the terminal edge and extends from the terminal edge to the apparatus to drive the apparatus between the extended and retracted positions in a manner analogous to the function of a connecting rod.

According to another aspect, the extension panel can be formed integrally with a face panel that is secured in stacked relation to the other of the panels.

According to other aspects: the link can be formed integrally with the face panel and the extension panel and be hingedly coupled to the terminal edge by a living hinge; and the living hinge can be a fold.

According to another aspect, the apparatus can comprise a flash drive having a USB connector.

According to another aspect, the apparatus can further comprise a carrier panel to which the flash drive is secured and which is formed integrally with the link, the extension panel and the face panel.

According to another aspect, the carrier panel, link, extension panel and face panel can be formed out of cardboard.

According to another aspect, the apparatus can be coupled to the one of the panels by means of a cover panel which is disposed in stacked relation to the one of the panels and secured thereon to define a sleeve which defines an opening that extends in direction substantially perpendicular to the axis and in which the apparatus is mounted for telescopic movement between the extended and retracted positions.

According to another aspect, the cover panel can be formed out of cardboard.

According to another aspect, the cover panel can be shaped and dimensioned such that, when the one panel is in the closed position and the apparatus is in the retracted position, the apparatus is disposed interiorly of the sleeve.

According to another aspect, a magnet can be disposed in the sleeve to permit the card to serve as a refrigerator magnet.

According to other aspects: the two panels can be formed integrally and the axis can be defined by a living hinge; and the living hinge can be a fold.

According to another aspect, the two panels can be formed out of cardboard.

Other advantages, features and characteristics of the present invention, as well as methods of operation and functions of the related elements of the structure, and the combination of parts and economies of manufacture, will become more apparent upon consideration of the following detailed description and the appended claims with reference to the accompanying drawings, the latter being briefly described hereinafter.

DETAILED DESCRIPTION OF THE PREFERRED EMBODIMENT

Reference is now made to the drawings, wherein an exemplary embodiment of the improved business card of the present invention is shown.

Figure 6:
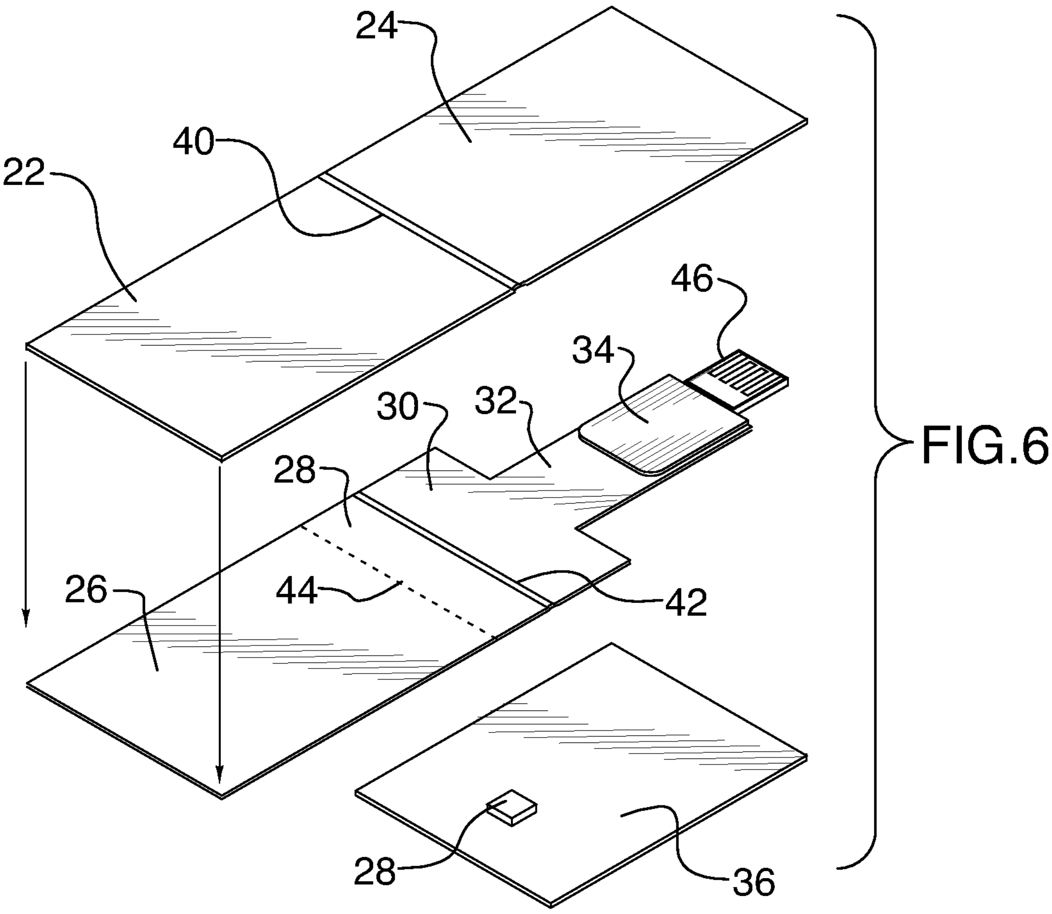
FIG. 6 is an exploded view of the structure of FIG. 5.
Figure 7:
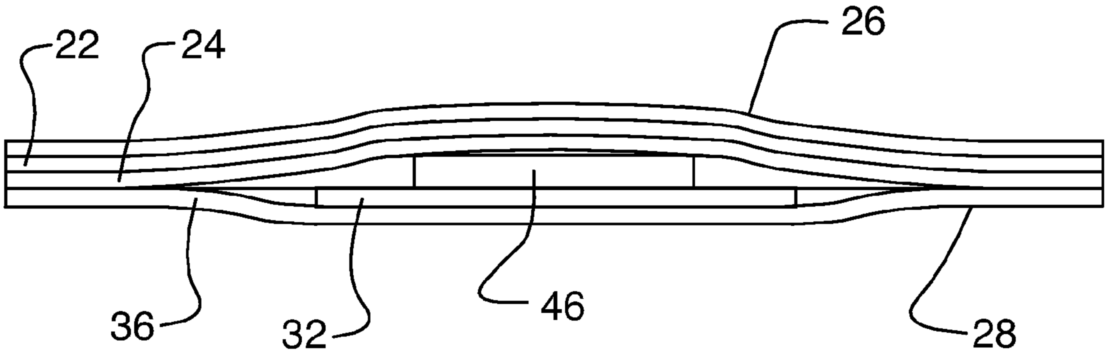
FIG. 7 is an end view of the structure of FIG. 1.

Turning first to the discrete parts of the business card, these are best seen in the exploded view of FIG. 6 and will be understood to include: two panels 22, 24; a face panel 26; an extension panel 28; a link 30; a carrier panel 32; flash drive 34; a cover panel 36; and a magnet 38.

The two panels 22, 24 are formed integrally out of cardboard and have an associated axis 40 defined by a living hinge in the form of a fold which hingedly couples the panels 22,24 together.

The face panel 26, extension panel 28, link 30 and carrier panel 32 are formed integrally out of cardboard. A living hinge in the form of a fold 42 delineates the boundary of the extension panel 28 and the link 30. Also shown on FIG. 6 is a dotted line 44, but it will be understood that this line simply delineates the boundary between the exemplary face panel 26 and the exemplary extension panel 28 and is merely notional.

Flash drive 34 terminates in a USB connector 46 and is adhesively secured to carrier panel 32; the flash drive 34, USB connector 46 and carrier panel 32 collectively define apparatus for coupling to a computer device.

The cover panel 36 is constructed of cardboard.

The magnet 38 is adhesively secured to panel 36.

Figure 1:
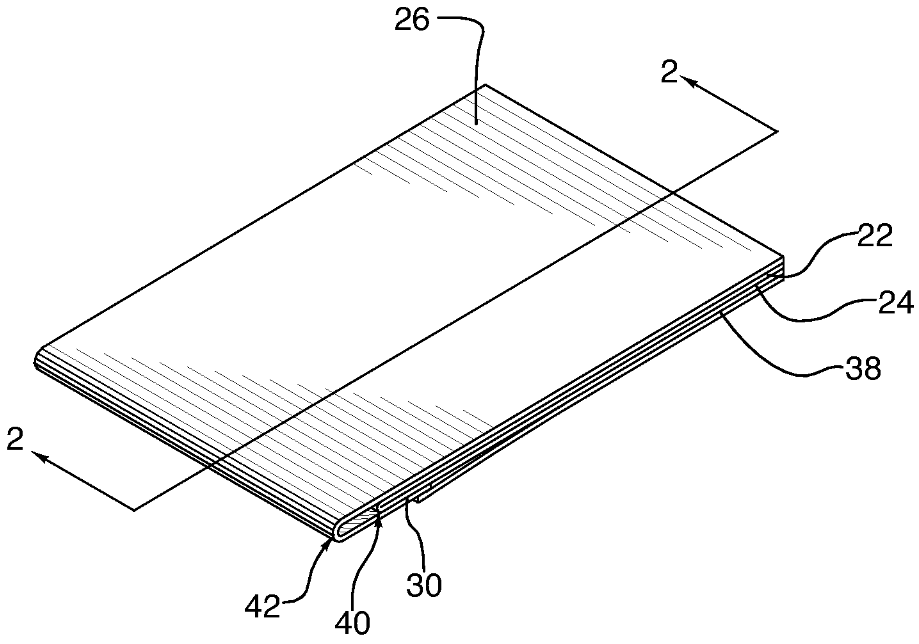
FIG. 1 is a perspective view of a card according to the exemplary embodiment, in a closed configuration.
Figure 2:
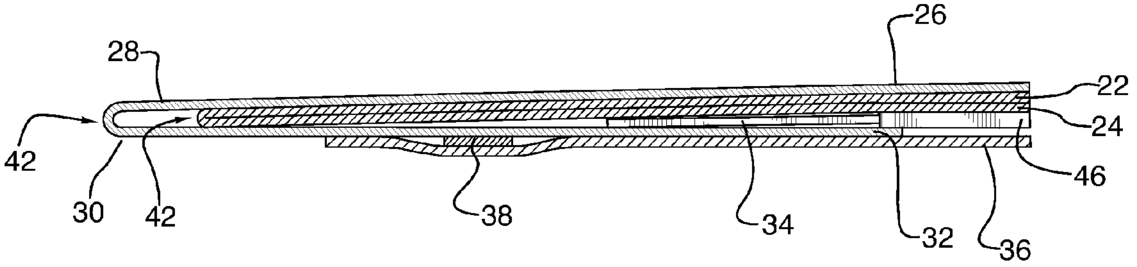
FIG. 2 is a view along section 2-2 of FIG. 1.
Figure 4:
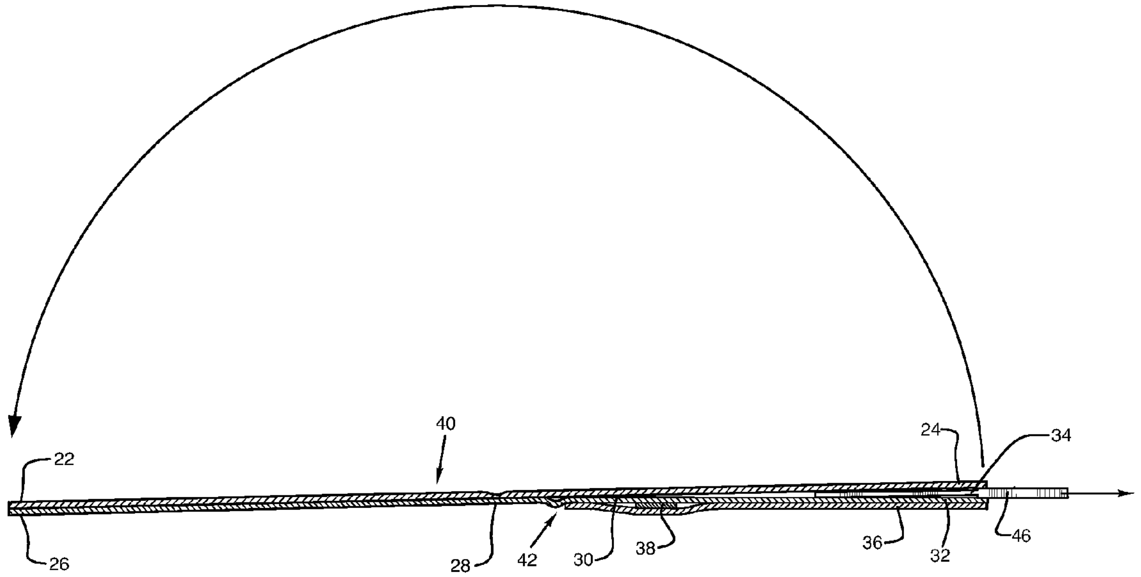
FIG. 4 is a view similar to FIG. 2, with the card in an open configuration.
Figure 5:
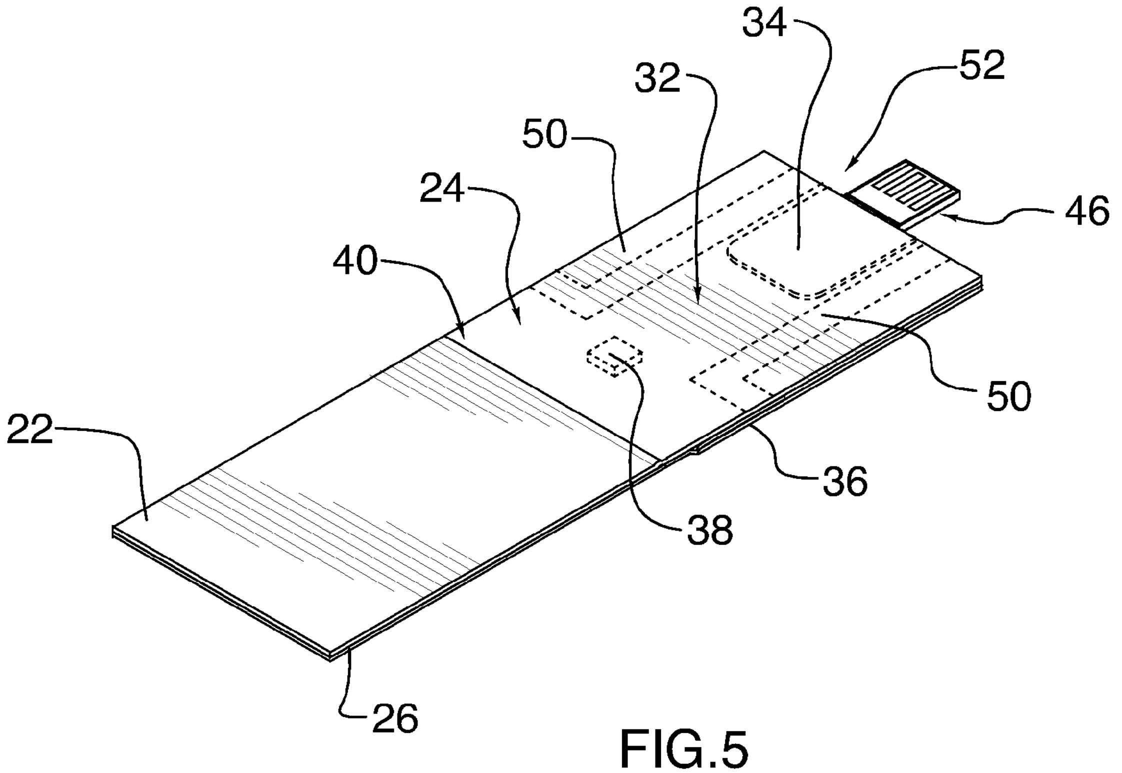
FIG. 5 is a perspective view of the structure of FIG. 1, in the open configuration.

Reference is now made to FIG. 5, which shows the various components assembled for use and wherein it will be seen that:

- the apparatus 32,34,46 [partly shown in phantom] is coupled to one 24 of the panels 22,24 by means of cover panel 36 which is disposed in stacked relation to the one 24 of the panels and secured thereto by two opposed edge seams 50,50 to form a sleeve 52 which defines an opening that extends in direction substantially perpendicular to the axis 40 and in which the apparatus 32,34, 46 is mounted for telescopic movement between the extended and retracted positions
- magnet 38 [shown in phantom] is disposed in the sleeve
- face panel 26 is secured in stacked, coterminous relation to the other 22 of the panels In terms of use of the card, as an initial matter, it will be appreciated that the connection between the two panels 22, 24 permits the one 24 of the panels to move about the axis 40 in a manner analogous to the movement of a page in a book, i.e. between a closed position wherein the panels 22,24 are disposed in stacked relation to one another and an open position, wherein the panels 22,24 extend away from one another and away from the axis 40. The coupling provided by the sleeve 52 causes the apparatus 32,34,46 to move with the one 24 of the panels as the one panel 24 moves relative to the other 22 panel and also allows the apparatus 32,34,46 to move telescopically within the sleeve 52 in a direction perpendicular to the axis 40. The foregoing allows the device to assume, inter alia, a closed configuration, shown in FIGS. 1 and 2, and an open configuration, shown in FIGS. 4 and 5.

In the closed configuration: the one panel 24 is in the closed position; the apparatus 32,34,46 is at a retracted position wherein the apparatus 32,34,46 is disposed in stacked relation to the one 24 of the panels; the USB connector 46 is disposed interiorly of the sleeve 52 and protected against damage; and the magnet 38 is positioned so as to permit, if desired, the device to function as a refrigerator magnet, with the face panel 26 presenting outwardly and the cover panel 36 secured to a refrigerator or other metal surface in a conventional manner.

In the open configuration: the one panel 24 is in the open position relative to the other panel 22; the apparatus 32, 34, 46 is in an extended position wherein the apparatus 32, 34, 46 extends beyond the one 24 of the panels; and, the USB connector 46 is disposed exteriorly of the sleeve 52, so as to permit coupling to a computer or similar device in a conventional manner.

Figure 3:
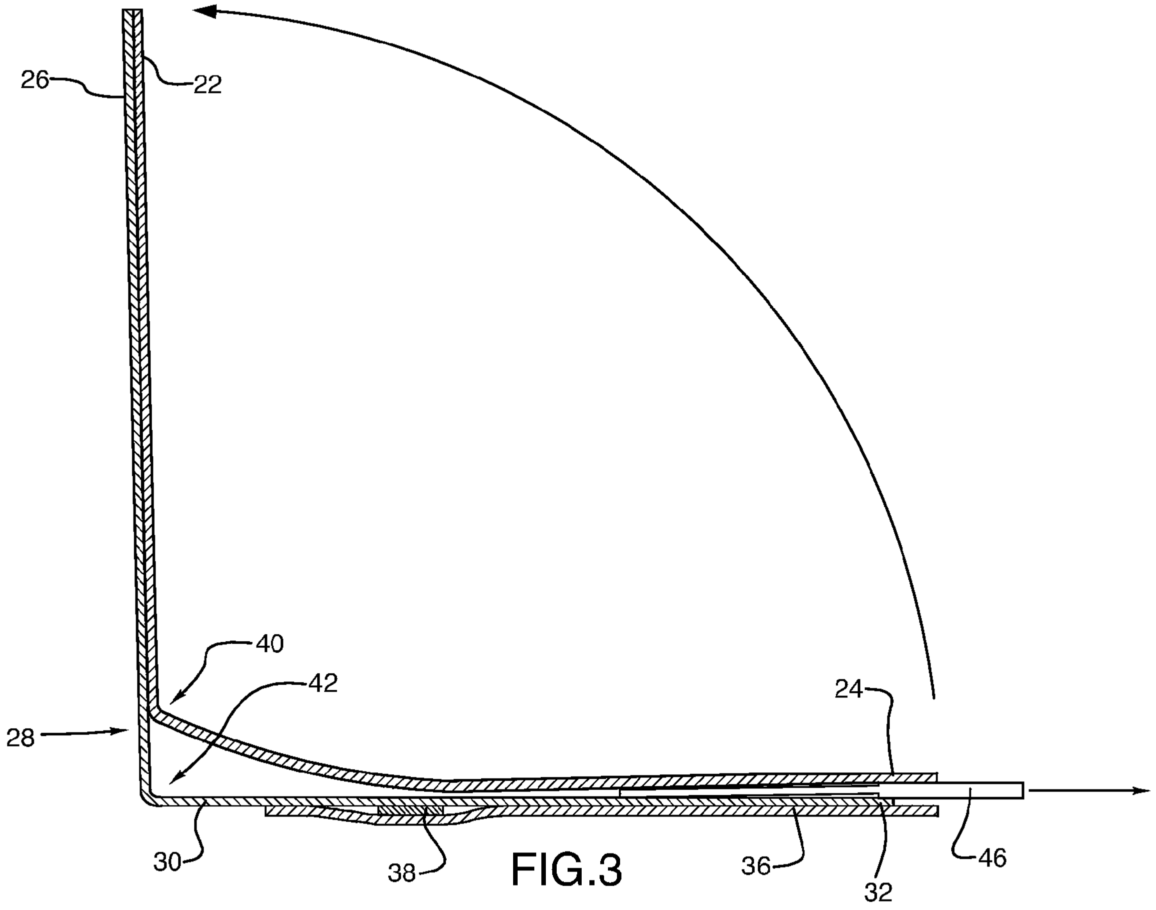
FIG. 3 is a view similar to FIG. 2, with the card in an intermediate configuration.

Reference is now made to FIG. 3, which shows a configuration intermediate the open and closed configurations and is illustrative of the operation of the link 30. In this regard, it will be recalled that the hinges 40, 42 are offset from one another along the face panel 26. Thus, as the one panel 24 is moved about hinge 40, the distance between hinge 42 and sleeve 52 varies. It will equally be recalled that carrier panel 32 is mounted in the sleeve 52 in the manner of a piston. Thus, it will be appreciated that a suitably rigid connection between the hinge 42 and the carrier panel 32 will, upon movement of the one panel about hinge 40, force movement of the carrier panel 32 in the sleeve 52 in a manner analogous to the function of a connecting rod; this function is served by link 30 in the exemplary embodiment, which causes apparatus 32,34,46 to move, upon movement of the one panel 24 between the open position and the closed position, between the extended position and the retracted position.

It will be appreciated that the foregoing apparatus provides substantial advantage:

- the card has the capacity to carry advertising in a manner similar to a conventional folding business card, on the outwardly-presenting faces of panels 22,24,26 and 38
- the card has the capacity to function in a manner similar to a conventional refrigerator magnet
- the card is relatively inexpensive to construct
- the card carries apparatus adapted for coupling to a computer
- the apparatus for computer coupling is shielded by the remainder of the device when in the closed configuration, to reduce the likelihood of inadvertent damage A suitable use for the apparatus is to direct a computer device to a web page associated with the business that commissioned the card; this can be easily accommodated by suitably programming the flash drive.

Whereas but a single embodiment of the present invention has been herein shown and described, it will be understood that this is not intended to be limiting.

For example, whereas the magnet is indicated to be useful for the purpose of rending the apparatus functional as a fridge magnet, the magnet can also be used for other purposes. For example, the apparatus could be provided as part of a print pamphlet or booklet, having a magnet disposed interiorly thereof, and the magnet of the apparatus could be used to secure the apparatus either interiorly or exteriorly of the pamphlet or booklet. This would create yet further business promotional opportunities for the apparatus.

For example, whereas a USB connector is shown, this is not essential; other connectors could equally be utilized.

As well, whereas a flash drive is described, this also is not essential; any device capable of storing data or instructions for delivery via a connector could be used to similar effect.

Further, whereas a magnet is shown, this obviously could be omitted, if the refrigerator magnet functionality was deemed undesirable.

As well, whereas cardboard is described, it will be evident that the device could be constructed from metal or plastic, with suitable modification to the hinges.

Accordingly, the present invention should be understood as limited only by the accompanying claims, purposively construed.

What is claimed is:

1. A business card for use with a computing device, the business card comprising:

two panels having an associated axis, one of the two panels being connected to the other of the two panels for movement about the axis in a manner analogous to a movement of a page in a book so as to permit movement of the one panel relative to the other between a closed position, wherein the two panels are disposed in stacked relation to one another, and an open position, wherein the panels are extended away from one another and away from the axis and are at least substantially coplanar;

an apparatus adapted for coupling to said computing device and itself operatively coupled to the one of the two panels such that the apparatus moves with the one of the panels as the one panel moves relative to the other panel between the open and closed positions; and is movable relative to the one of the panels, in a direction substantially perpendicular to the axis, between a retracted position, wherein the apparatus is disposed in stacked relation to the one of the panels, and an extended position, wherein the apparatus extends beyond the one of the panels; and a mechanism for causing the apparatus to move, upon the movement of the one panel between the open position and the closed position, between the extended position and the retracted position.

2. A card according to claim 1, wherein the mechanism comprises:

an extension panel, the extension panel being orientated substantially coplanar with the other of the panels and extending away from both the other of the panels and the axis to a terminal edge that is substantially parallel to the axis; and a link that is hingedly coupled to the terminal edge for relative movement of the link about the terminal edge and extends from the terminal edge to the apparatus to drive the apparatus between the extended and retracted positions in a manner analogous to the function of a connecting rod.

3. A card according to claim 2, wherein the extension panel is formed integrally with a face panel that is secured in stacked relation to the other of the panels.

4. A card according to claim 3, wherein the link is formed integrally with the face panel and the extension panel and is hingedly coupled to the terminal edge by a living hinge.

5. A card according to claim 4, wherein the living hinge is a fold.

6. A card according to claim 2, wherein the apparatus comprises a flash drive having a USB connector.

7. A card according to claim 6, wherein the apparatus further comprises a carrier panel to which the flash drive is secured and which is formed integrally with the link, the extension panel and the face panel.

8. A card according to claim 7, wherein the carrier panel, link, extension panel and face panel are formed out of cardboard.

9. A card according to claim 2, wherein the apparatus is coupled to the one of the panels by means of a cover panel which is disposed in stacked relation to the one of the panels and secured thereon to define a sleeve which defines an opening that extends in direction substantially perpendicular to the axis and in which the apparatus is mounted for telescopic movement between the extended and retracted positions.

10. A card according to claim 9, wherein the cover panel is formed out of cardboard.

11. A card according to claim 10, wherein the cover panel is shaped and dimensioned such that, when the one panel is in the closed position and the apparatus is in the retracted position, the apparatus is disposed interiorly of the sleeve.

12. A card according to claim 9, further comprising a magnet disposed in the sleeve to permit the card to serve as a refrigerator magnet.

13. A card according to claim 1, wherein the two panels are formed integrally and the axis is defined by a living hinge.

14. A card according to claim 13, wherein the living hinge is a fold.

15. A card according to claim 14, wherein the two panels are formed out of cardboard.

* * * * *